(12) United States Patent
Lee

(10) Patent No.: US 7,495,286 B2
(45) Date of Patent: Feb. 24, 2009

(54) HIGH-VOLTAGE SEMICONDUCTOR DEVICE STRUCTURE

(75) Inventor: Chi-Hsiang Lee, Science-Based Industrial Park (TW)

(73) Assignee: Leadtrend Technology Corp., Hsin-Chu (TW)

( * ) Notice: Subject to any disclaimer, the term of this patent is extended or adjusted under 35 U.S.C. 154(b) by 277 days.

(21) Appl. No.: 11/639,558

(22) Filed: Dec. 15, 2006

(65) Prior Publication Data

US 2008/0079072 A1 Apr. 3, 2008

(30) Foreign Application Priority Data

Sep. 29, 2006 (TW) .............................. 95136376 A

(51) Int. Cl.
*H01L 29/76* (2006.01)
*H01L 31/062* (2006.01)
(52) U.S. Cl. ..................... 257/340; 257/409; 438/140
(58) Field of Classification Search ................ 257/340, 257/335, 409, 328, E29.256–29.261; 438/140
See application file for complete search history.

(56) References Cited

U.S. PATENT DOCUMENTS 6,133,591 A * 10/2000 Letavic et al. ............... 257/139
6,593,621 B2 * 7/2003 Tsuchiko et al. ............ 257/335

* cited by examiner

*Primary Examiner*—Theresa T Doan
(74) *Attorney, Agent, or Firm*—Winston Hsu

(57) ABSTRACT

A high-voltage semiconductor device structure is provided, which includes a drain structure having two curved structures that are insulatedly adjacent to each other and alternatively arranged, and a source structure, a drain extension structure, and a gate structure formed between the two curved structures. By using the curved structures with alternatively arranged configuration, an electrode terminal with a small curvature radius is prevented from being produced, and the electric field accumulation effect is partially eliminated, thereby increasing the breakdown voltage. Meanwhile, the curved structure with alternatively arranged configuration not only reduces the ON resistance, but also utilizes the space effectively, thus, the integration of the semiconductor device on the chip is enhanced, so that the miniaturization requirement of an electronic device is satisfied.

11 Claims, 3 Drawing Sheets

HIGH-VOLTAGE SEMICONDUCTOR DEVICE STRUCTURE

CROSS-REFERENCE TO RELATED APPLICATIONS

This non-provisional application claims priority under 35 U.S.C. §119(a) on Patent Application No(s). 095136376 filed in Taiwan, R.O.C. on Sep. 29, 2006, the entire contents of which are hereby incorporated by reference.

BACKGROUND OF THE INVENTION

1. Field of Invention

The present invention relates to a high-voltage semiconductor device structure, and more particularly, to a lateral-diffused metal oxide semiconductor (LDMOS) device structure.

2. Related Art

An LDMOS device is usually applied in a high voltage operation environment, for example, a power amplifier with a high power or a high frequency band, or a high power device of a base station. The LDMOS has a high voltage resistance characteristic, which is capable of resisting tens to hundreds volts of voltage. The main reason lies in that, the LDMOS has a low-doped drift extension region in the drain extension structure, which is used to relieve the breakdown effect between a drain terminal and a source terminal, thus the device has a relatively high breakdown voltage. In order to provide the LDMOS with a higher breakdown voltage, the structure of the device must be improved.

FIGS. 1A and 1B are respectively an allocation diagram and a sectional view of an LDMOS device structure in the conventional art. As shown in FIG. 1A, the conventional LDMOS 10 structure includes a source structure 11, a drain structure 12, a drain extension structure 13, and a gate structure 14.

The source structure 11 has a protrusion 11' extending from the lower portion of the source structure 11 to the central portion, and the protrusion 11' is surrounded by and spaced apart for a predetermined distance with the upper, left, and right side portion of the source structure 11 respectively. The drain structure 12 is disposed in the region formed by the above predetermined distances, and forms an oxbow-shaped region that surrounds the left, upper and right side of the protrusion 11', and the periphery of the oxbow-shaped region is surrounded by the source structure 11 outside the protrusion 11'. The drain extension structure 13 surrounds the periphery of the drain structure 12 and it is spaced apart for a specific distance with the source structure 11. Meanwhile, a gate structure 14 is provided between the source structure 11 and the drain extension structure 13, and a field effect channel region is provided below the gate structure 14. Under the low ON-resistance (Rdson) requirement of the high voltage device, the layout feature of the protrusion 11' cannot be easily avoided.

FIG. 1B is a sectional view of FIG. 1A taken alone the line I-I. The source structure 11 includes a source electrode 16 formed on the surface of a substrate (e.g., a p-type substrate 15); a p-type well 17 formed in the p-type substrate 15 and located below the source electrode 16, which is doped with p-type conductive ions; an $n^+$-type doped region 18 formed in the p-type well 17, which is a region having n-type conductive ions with a high doping concentration; a $p^+$-type doped region 19 formed in the p-type well 17 and being adjacent to the $n^+$-type doped region 18, which is a region having p-type conductive ions with a high doping concentration; wherein the $n^+$-type doped region 18 and the $p^+$-type doped region 19 are both connected with the source electrode 16.

The source structure 12 includes a drain electrode 20 formed on the surface of the p-type substrate 15; an n-type well 21 located below the drain electrode 20 and formed in the p-type substrate 15; an $n^+$-type doped region 22 formed in the n-type well, which is a region having n-type conductive ions with a high doping concentration and connected with the drain electrode 20.

The drain extension structure 13 includes an n-type drift extension region 23 having n-type conductive ions with a low doping concentration, and a p-type doped region 24 formed in the n-type drift extension region 23. There is a predetermined distance between the n-type drift extension region 23 of the drain extension structure 13 and the $n^+$-type doped region 18 of the source structure 11, to form a field effect channel region 27.

The gate structure 14 includes a gate insulation layer 25 formed on the surface of the substrate and a gate electrode 26 formed on the gate insulation layer 25. The gate structure 14 is disposed above the n-type drift extension region 23 and the p-type well 17, and the field effect channel region 27 is turned on/off by controlling the gate voltage.

In the above LDMOS structure, the source protrusion 11' has a tip 111 with a small curvature radius which easily produces a charge accumulation phenomenon and makes the intensity of the electric field passing through this portion become stronger, thus, the electric field in the field effect channel region is non-uniformly distributed. During the operation under a high voltage, a breakdown effect occurs due to a local accumulation effect of the electric field, thus, the breakdown voltage of the LDMOS is reduced. If it is intended that the breakdown voltage of the device is not affected by the protrusion 11', the curvature radius must be increased. However, the overall area of the device is enlarged accordingly, and correspondingly, the ON-resistance (Rdson) is increased, and the integration of the device on the chip is reduced.

SUMMARY OF THE INVENTION

As for the electrode terminal with a small curvature radius in the conventional art, a charge accumulation easily occurs, so that the electric field intensity in the field effect channel is non-uniformly distributed, thus the breakdown voltage is decreased. Therefore, the present invention provides a high-voltage semiconductor device structure having a high breakdown voltage, which not only has a low ON-resistance, but also improves the integration of the semiconductor device on the chip, so as to satisfy the miniaturization requirements of the electronic device.

The high-voltage semiconductor device structure of the present invention comprises a substrate, a drain structure, a drain extension structure, a source structure, and a gate structure.

The drain structure is formed on the substrate and includes two curved structures being insulatedly adjacent to each other and alternatively arranged. Three kinds of different regions are defined between the two curved structures for allocating structures with different functions, which includes two first regions, two second regions, and a third region, wherein the first regions are adjacent to the curved structures, the second regions are adjacent to the first regions, and the third region is located between the two second regions. Moreover, each curved structure comprises a first well, a first doped region, and a drain electrode. The drain electrode is formed on the surface of the substrate; the first doped region is formed in the substrate below the drain electrode, which is a region doped with conductive ions and extending downwards from the surface of the substrate and connected with the drain electrode; the first well is formed in the substrate and surrounds the first doped region, and the first well is formed by a region doped with conductive ions.

The drain extension structure is formed in the substrate and located in the first region, which comprises a drift extension region having conductive ions and being adjacent to the first well.

The source structure is formed in the substrate and located in the third region. The source structure comprises a second well, at least one second doped region, and a source electrode. The source electrode is formed on the substrate, and connected with the second doped region formed in the substrate below the source electrode, and the second well surrounds the periphery of the second doped region. The second well and the second doped region are both doped with conductive ions.

The gate structure is formed on the substrate and located in the second region, and a field effect channel region is formed below the gate structure. The on/off state of the field effect channel region is controlled through the gate structure. The gate structure comprises a gate insulation layer and a gate electrode, wherein the gate insulation layer is formed on the surface of the substrate above the field effect channel region, and the gate electrode is covered on the gate insulation layer.

By using the high-voltage semiconductor device structure of the present invention, the electric field accumulation phenomenon at the tip between the source structure and the drain structure is avoided, and the breakdown voltage of the semiconductor device is effectively enhanced. Through disposing the drain structure having the curved structures which are alternatively arranged, the ON-resistance is reduced, the space is fully utilized, and the integration of the semiconductor device on the chip is enhanced, thereby satisfying the miniaturization requirement for the electronic device.

Further scope of applicability of the present Invention will become apparent from the detailed description given hereinafter. However, it should be understood that the detailed description and specific examples, while indicating preferred embodiments of the Invention, are given by way of illustration only, since various changes and modifications within the spirit and scope of the Invention will become apparent to those skilled in the art from this detailed description.

BRIEF DESCRIPTION OF THE DRAWINGS

The present Invention will become more fully understood from the detailed description given herein below for illustration only, which thus is not limitative of the present Invention, and wherein.

DETAILED DESCRIPTION OF THE INVENTION

Figure 1A:
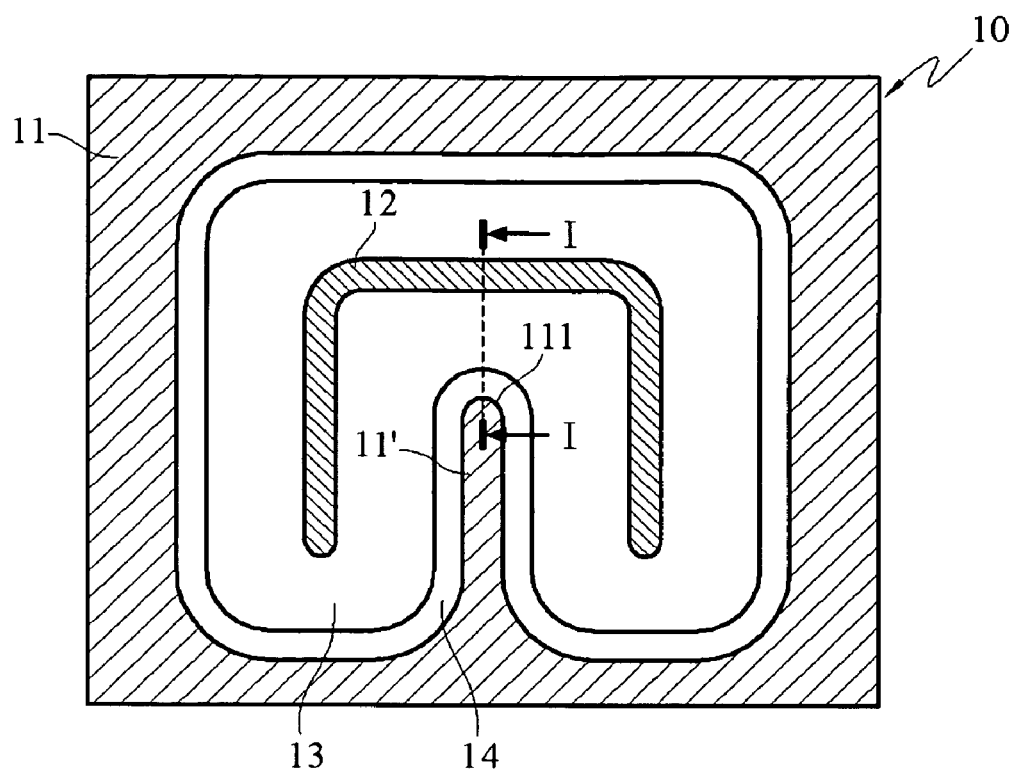
FIG. 1A is an allocation diagram of an LDMOS device structure of the conventional art.
Figure 1B:
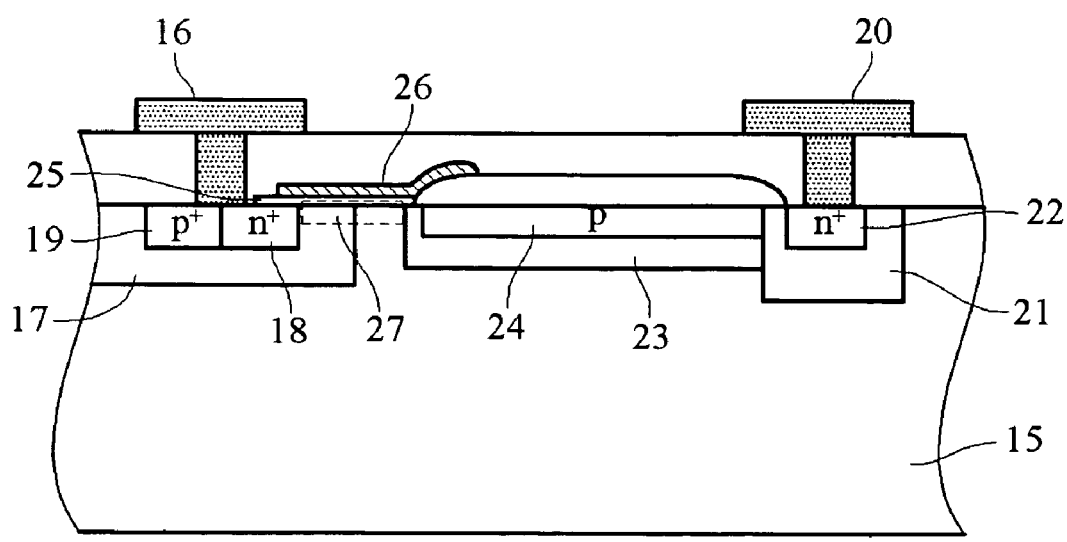
FIG. 1B is a sectional view of the LDMOS device structure of the conventional art.
Figure 2A:
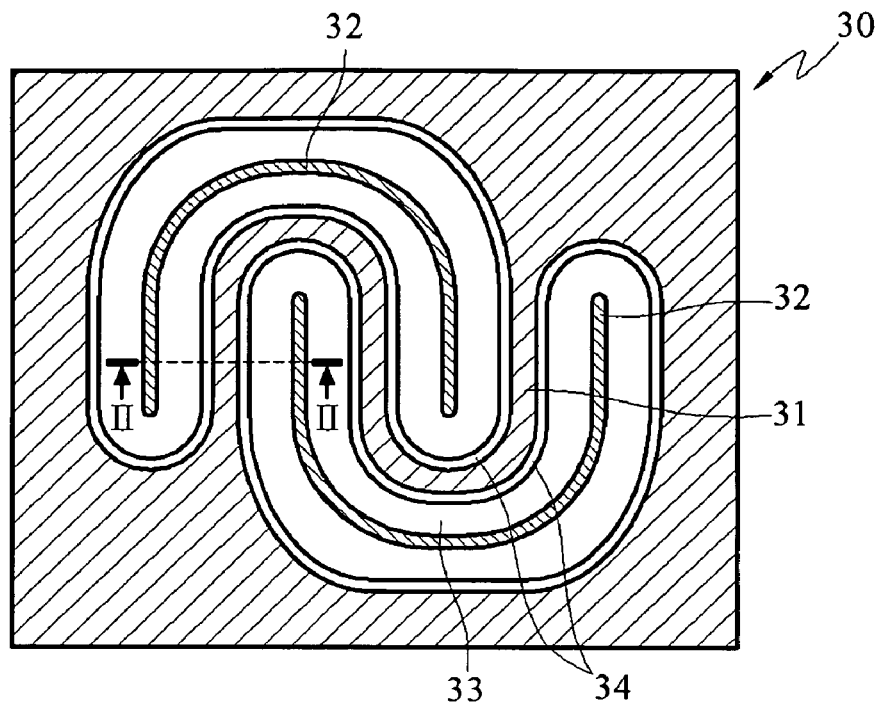
FIG. 2A is an allocation diagram of a high-voltage semiconductor device structure according to a preferred embodiment of the present invention.

FIG. 2A is an allocation diagram of a high-voltage semiconductor device structure of the present invention. The high-voltage semiconductor device structure 30 includes a drain structure 32, a drain extension structure 33, a source structure 31, and a gate structure 34.

The drain structure 32 is formed by two separated curved structures (e.g., horse-shoe-shaped or U-shaped structure, which are not intended to limit the application scope of the present invention) that are insulatedly adjacent to each other and alternatively arranged. Three different kinds of regions are defined between the two curved structures: two first regions, two second regions, and a third region, whose relative arrangement positions are described as follows: the first regions, the second regions adjacent to the first regions, and the third region adjacent to the second regions successively extends outwards from the curved structure, wherein the third region is located between the two second regions.

Figure 2B:
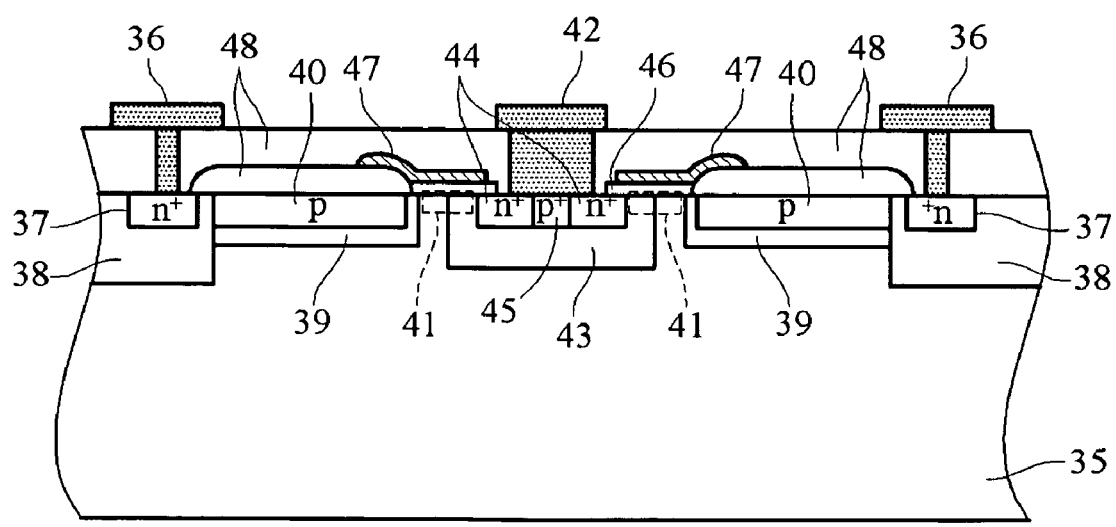
FIG. 2B is a sectional view of a high-voltage semiconductor device structure according to a preferred embodiment of the present invention.

FIG. 2B is a sectional view of FIG. 2A taken alone the line II-II. As shown in FIG. 2B, the curved structure includes a drain electrode 36, an $n^+$-type doped region 37, and an n-type well 38. The drain electrode 36 is formed on a substrate (e.g., a p-type substrate 35); the $n^+$-type doped region 37 is a region formed by extending the contact surface between the drain electrode 36 and the p-type substrate 35 downwards for a predetermined distance and it is doped with n-type conductive ions with a high concentration; the n-type well 38 is formed in the p-type substrate 35 and surrounds the periphery of the $n^+$-type doped region 37. Moreover, although the two curved structures are separated independent structures, the drain electrodes 36 are connected with each other through a wire bonding design.

The drain extension structure 33 is located in the first region and includes an n-type drift extension region 39 and a p-type doped region 40. The n-type drift extension region 39 is adjacent to the n-type well 38 and doped with conductive ions with a low concentration; the p-type doped region 40 is formed in the region surrounded by the n-type drift extension region 39 and it is a region formed by extending downwards from the surface of the p-type substrate 35, and moreover, the p-type doped region 40 is doped with p-type conductive ions.

The source structure 31 is formed in the p-type substrate 35 and located in the third region. Moreover, the source structure 31 includes a source electrode 42, a p-type well 43, two $n^+$-type doped region 44, and a $p^+$-type doped region 45. The source electrode 42 is formed on the p-type substrate 35. The p-type well 43 is formed in the p-type substrate 35 below the source electrode 42, which is doped with p-type conductive ions. The two $n^+$-type doped regions 44 and the $p^+$-type doped region 45 are formed in the p-type substrate 35 and surrounded by the p-type well 43, wherein the $p^+$-type doped region 45 is located between the two $n^+$-type doped regions 44, and the $n^+$-type doped region 44 and the $p^+$-type doped region 45 are both connected with the source electrode 42. Moreover, the $n^+$-type doped region 44 is doped with n-type conductive ions with a high concentration, and the $p^+$-type doped region 45 is doped with p-type conductive ions with a high concentration.

The gate structure 34 is formed on the surface of the p-type substrate 35 and located in the above second region. Moreover, a field effect channel region 41 is formed below the gate structure 34, i.e., between the n-type drift extension region 39 and the $n^+$-type doped region 44. The gate structure 34 includes a gate electrode 47 and a gate insulation layer 46. The gate insulation layer 46 is formed on the surface of the p-type substrate 35 above the field effect channel region 41, and the gate electrode 47 is covered on the gate insulation layer 46. The on/off of the field effect channel region 41 is controlled by the gate structure 34.

Moreover, an insulation layer 48 (e.g., a silicon oxide layer) is formed respectively between the drain structure 32, the source structure 31, and the gate structure 34 to ensure the electrical insulation effect, so as to avoid the short circuit phenomenon between each structure.

Figure 3:
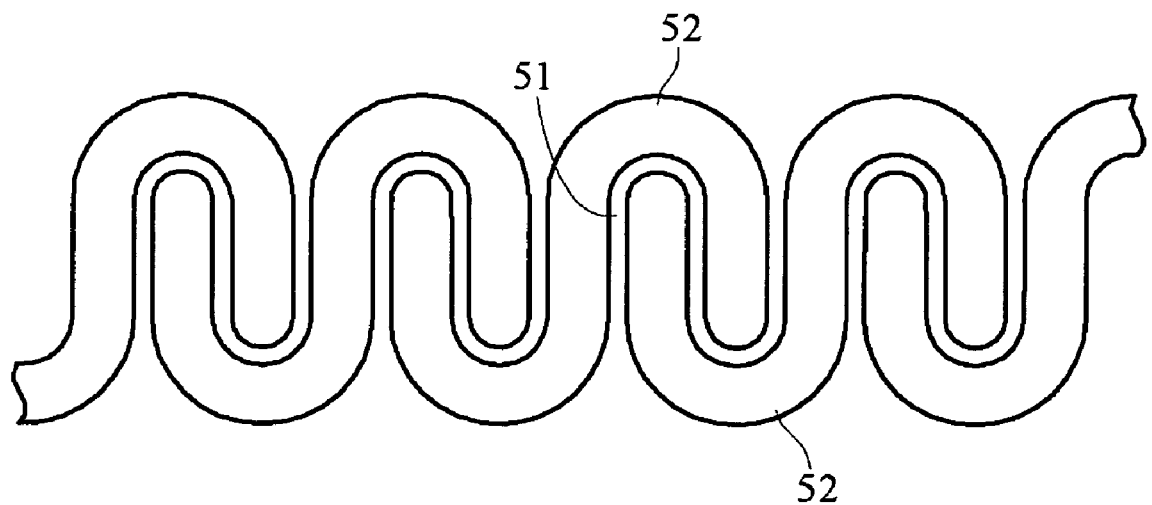
FIG. 3 is a schematic view of an extension structure of the high-voltage semiconductor device of the present invention.

FIG. 3 is a schematic view of an extension structure of the high-voltage semiconductor device of the present invention. The drain structure 52 is a configuration formed by alternatively arranged S-shaped structures, and it still includes the drain extension structure surrounding the periphery of the drain structure 52. The source structure 51, formed in the alternatively arranged region, is an S-shaped configuration. The gate structure (not shown) is disposed between the drain structure 52 and the source structure 51.

Figure 4:
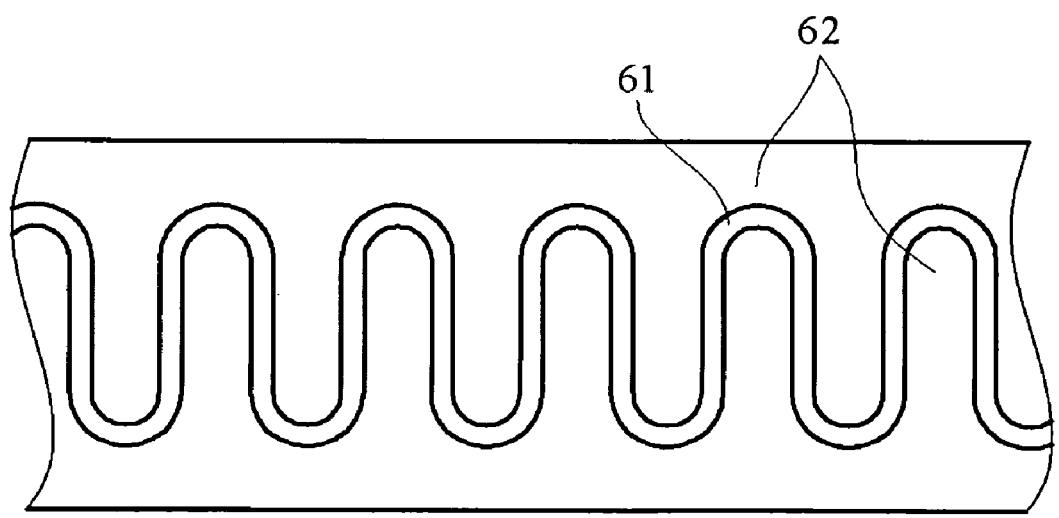
FIG. 4 is a schematic view of another extension structure of the high-voltage semiconductor device of the present invention.

FIG. 4 is a schematic view of another extension structure of the high-voltage semiconductor device of the present invention. The drain structure 62 is formed by two comb-shaped structures which are alternatively arranged, and it still includes the drain extension structure surrounding the periphery of the drain structure 62. The source structure 61 is formed in the alternatively arranged region and it is a successive S-shaped configuration. The gate structure (not shown) is disposed between the drain structure 62 and the source structure 61.

By using the above high-voltage semiconductor device structure having the source structure between the drain structures with curved structures which are alternatively arranged, the source structure no longer has an edge with a small curvature radius, so as to eliminate the electric field local accumulation phenomenon at the tip caused by the source protrusion in the conventional art, thus, the field effect channel region formed by the source structure and the drain extension structure has a uniform electric field distribution, and thereby effectively increasing the breakdown voltage of the semiconductor. Meanwhile, through the special curved structures of the drain structure, the device has a relatively low ON-resistance, the space is effectively utilized, and the integration of the semiconductor device on the chip is enhanced, so as to cater to the technique of fabricating the electronic device with a high storage capability.

The Invention being thus described, it will be obvious that the same may be varied in many ways. Such variations are not to be regarded as a departure from the spirit and scope of the Invention, and all such modifications as would be obvious to one skilled in the art are intended to be included within the scope of the following claims.

What is claimed is:

1. A high-voltage semiconductor device structure, comprising:
 a substrate;
 a drain structure, formed on the substrate by two curved structures that are insulatedly adjacent to each other and alternatively arranged, and two first regions, two second regions, and a third region are defined between the two curved structures, wherein the first regions are adjacent to the curved structures, the second regions are adjacent to the first regions, and the third region is located between the two second regions; each of the curved structures comprises a first well, a first doped region, and a drain electrode, wherein the drain electrode is formed on the substrate, the first doped region is formed in the substrate below the drain electrode and connected with the drain electrode, and the first well is formed in the substrate and surrounds the first doped region;
 a drain extension structure, formed in the substrate, located in the first region, and having a drift extension region adjacent to the first well;
 a source structure, formed in the substrate, located in the third region, and comprising a second well, at least one second doped region, and a source electrode, wherein the source electrode is formed on the substrate, the at least one second doped region is formed in the substrate below the source electrode and connected with the source electrode, and the second well is formed in the substrate and surrounds the at least one second doped region; and
 a gate structure, formed on the substrate, located in the second region, and comprising a gate insulation layer and a gate electrode, wherein a field effect channel region is formed below the gate structure.

2. The high-voltage semiconductor device structure as claimed in claim 1, wherein an insulation layer is provided between the gate structure and the adjacent drain structure and source structure.

3. The high-voltage semiconductor device structure as claimed in claim 1, wherein the first well is doped with n-type conductive ions, and the first doped region is doped with n-type conductive ions with a high concentration.

4. The high-voltage semiconductor device structure as claimed in claim 1, wherein the drift extension region is doped with n-type conductive ions with a low concentration.

5. The high-voltage semiconductor device structure as claimed in claim 1, wherein the drift extension region further comprises at least one third doped region that is doped with p-type conductive ions.

6. The high-voltage semiconductor device structure as claimed in claim 1, wherein the second well is doped with p-type conductive ions.

7. The high-voltage semiconductor device structure as claimed in claim 1, wherein the at least one second doped region is doped with n-type or p-type conductive ions, and the adjacent at least one second doped region is doped with different types of conductive ions.

8. The high-voltage semiconductor device structure as claimed in claim 1, wherein the drain electrode of the two curved structures is connected through a wire bonding design.

9. The high-voltage semiconductor device structure as claimed in claim 1, wherein the curved structure is a horseshoe-shaped or U-shaped structure.

10. The high-voltage semiconductor device structure as claimed in claim 1, wherein the curved structure is an S-shaped or a comb-shaped structure.

11. The high-voltage semiconductor device structure as claimed in claim 10, wherein the source structure is an S-shaped or a successive S-shaped structure.

* * * * *